United States Patent [19]

Chakrabarti et al.

[11] Patent Number: 4,749,255
[45] Date of Patent: Jun. 7, 1988

[54] COATING FOR OPTICAL DEVICES

[75] Inventors: Utpal K. Chakrabarti, North Plainfield; Aland K. Chin, Berkeley Heights; George J. Przybylek, South Plainfield; LeGrand G. Van Uitert, Morristown; George J. Zydzik, Columbia, all of N.J.

[73] Assignee: American Telephone and Telegraph Company, AT&T Bell Laboratories, Murray Hill, N.J.

[21] Appl. No.: 806,492

[22] Filed: Dec. 9, 1985

[51] Int. Cl.$^4$ .............................................. G02B 1/10
[52] U.S. Cl. .................................... 350/164; 350/166
[58] Field of Search ............... 350/164, 1.1, 319, 320; 372/96, 49, 48

[56] References Cited

U.S. PATENT DOCUMENTS

| | | | |
|---|---|---|---|
| 3,432,314 | 3/1969 | Mazdiyasni et al. | 350/319 |
| 3,984,581 | 10/1976 | Dobler et al. | 350/164 |
| 4,327,129 | 4/1982 | Sepp | 427/164 |

FOREIGN PATENT DOCUMENTS

| | | | |
|---|---|---|---|
| 35488 | 4/1981 | Japan | 372/49 |

OTHER PUBLICATIONS

Greene et al., "Growth and Characterization of Doped $ZrO_2$ and $CeO_2$ Films Deposited by Bias Sputtering", Journal of Vacuum Science and Technology, vol. 14, No. 1, Jan.-Feb. 1977, pp. 177-180.

Greene et al., "Morphological and Electrical Properties of rf Sputtered $Y_2O_3$-doped $ZrO_2$ Thin Films", Journal of Vacuum Science and Technology, v. 13, No. 1, Jan.-Feb. 1976, pp. 72-75.

Chin et al., "$Al_2O_3$ as an Antireflection Coating for InP/InGaAsP LEDs", Journal of Vacuum Science and Technology, B, vol. 1, No. 1, Jan.-Mar. 1983, pp. 72-73.

*Handbook of Thin Film Technology*, L. I. Maisset & R. Gilang, Editors, McGraw Hill Book Company (1970), pp. 1-50-1-54.

"Room Temperature CW Operation of Distributed-Feedback Buried-Heterostructure InGaAsP-/InP Lasers Emitting at 1.57 μm", *Electronics Letters*, vol. 17, Utaka et al., (Dec. 1981), pp. 961-962.

"V-Grooved-Substrate Buried Heterostructure InGaAsP/InP Laser Diodes," *Fujitsu Sci. Tech. J.*, vol. 18, H. Imai et al. (Dec. 1982), pp. 541-561.

"High Power InGaAsP Edge-Emitting LEDs for Single-Mode Optical Communication Systems", *Electronics Letters*, vol. 21, Olshansky et al., (Aug. 15, 1985), pp. 730-731.

"High-Power Multiple-Emitter AlGaAs Superluminescent Diodes", *Applied Physics Letters*, vol. 47, Paoli et al. (Sep. 1985), pp. 450-452.

*Primary Examiner*—Bruce Y. Arnold
*Assistant Examiner*—Terry S. Callaghan
*Attorney, Agent, or Firm*—Lester H. Birnbaum

[57] ABSTRACT

Disclosed is a device including a surface coating for passivation or anti-reflection, and a method of manufacture. The coating comprises $ZrO_2$ doped with yttrium, magnesium or calcium. The doped $ZrO_2$ is preferably deposited on the device surface by electron-beam evaporation from a single crystal source of $ZrO_2$ and $Y_2O_3$, MgO or CaO.

14 Claims, 1 Drawing Sheet

COATING FOR OPTICAL DEVICES

BACKGROUND OF THE INVENTION

This invention relates to optical devices, and in particular to providing a proper coating to the devices for improved performance.

Dielectric coatings play an important role in achieving desired performance of optical devices. For example, an anti-reflection coating on the facets of a III-V or II-VI semiconductor laser or on the surface of a light-emitting device or photodetector can increase the quantum efficiency of the device. In the case of a distributed feedback laser, the anti-reflection coating can also produce single longitudinal mode emission by suppressing the Fabry-Perot modes. A passivation coating on the facets of a III-V or II-VI laser or light-emitting diode can prevent oxidation at the semiconductor surface or evaporation of the elements of the device, thus permitting higher device reliability.

A variety of materials has been proposed for such layers including $ZrO_2$, $Al_2O_3$, $SiO_2$ and $SiN_x$. The $SiO_2$ and $SiN_x$ layers are usually deposited by sputtering, which can cause damage to the semiconductor surface. Electron-beam deposition of coatings such as $ZrO_2$ should not cause significant damage, but the addition of oxygen is usually required in the deposition process to get the proper stoichiometry for a desired refractive index. This requirement makes it difficult to form the layer reproducibly. While $Al_2O_3$ can be easily e-beam deposited, the values of reflectivity of coated laser facets with such layers tend to be high (greater than 4 percent) and, again, addition of oxygen is usually required to get the desired refractive index.

It is, therefore, an object of the invention to provide a passivation or anti-reflection coating for III-V and II-VI semiconductor devices with high yield and without adversely affecting device performance.

SUMMARY OF THE INVENTION

The foregoing and other objectives are achieved in accordance with the invention which is a III-V or II-VI semiconductor device comprising a coating formed over at least a portion of its surface. The coating comprises $ZrO_2$ and an oxide of an element selected from the group consisting of yttrium, magnesium and calcium.

In accordance with another aspect, the invention is a method of fabricating a III-V or II-VI semiconductor device which includes providing a coating on at least a portion of the device surface. The method comprises the steps of providing a material comprising $ZrO_2$ and an oxide of an element selected from the group consisting of yttrium, magnesium, and calcium, and electron-beam evaporating the material so as to deposit a coating on the semiconductor device.

BRIEF DESCRIPTION OF THE DRAWING

These and other features will be delineated in the description to follow. In the drawing.

It will be appreciated that, for purposes of illustration, these figures are not necessarily drawn to scale.

DETAILED DESCRIPTION

The invention will be described with reference to the schematic illustrations of the figures. A semiconductor device is shown as 10. This device can be any III-V or II-VI laser, light-emitting diode or photodetector. By way of example only, the device could be an InP-based distributed feedback (DFB) laser or channeled-substrate buried-heterostructure (CSBH) laser. Such structures are well known in the art and consequently, are not shown or discussed in detail (see, for example, Imai et al, "V-Grooved Substrate Buried Heterostructure InGaAsP/InP Laser Diodes," *Fujitsu Scientific Technical Journal*, Vol. 18, pp. 541–561 (December 1982), and Utaka et al, "Room Temperature CW Operation of Distributed-Feedback Buried Heterostructure InGaAsP/InP Lasers . . . ", *Electronics Letters*, Vol. 17, page 961 (1981)). Formed on one mirror facet of the laser is a coating, 11, which in this example is an anti-reflection (AR) coating having a thickness of $\lambda/(4n)$, or odd multiple thereof, where $\lambda$ is the wavelength of emitted light and n is the index of refraction of the coating. (In the case of a photodetector device, $\lambda$ would be the wavelength of the received light.) The coating is of a type described in more detail below. On the other facet is a highly reflective coating, 12, of a material such as alternate layers of Si and $ZrO_2$. As a result of these two coatings, the laser is capable of emitting a higher power beam from the Ar-coated facet that would be the case of an uncoated laser. If the laser is of the distributed feedback type, the AR coating will also suppress the normal Fabry-Perot modes of the laser cavity so that a single longitudinal mode emission is produced. In systems where the laser is optically pumped, both laser facets could be coated with the AR layer so that a laser amplifier is produced.

The layer, 11, can also act as a passivation coating if the thickness is changed to an odd multiple of $\lambda/(2n)$. In such cases, both facets are usually coated, and the layer serves to prevent degradation of the facets which might occur due to operation at high optical powers or the application of higher than normal current pulses.

Figure 1:
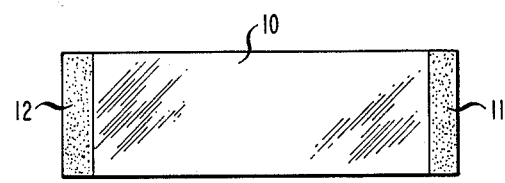
FIG. 1 is a side schematic view of a III-V or II-VI semiconductor device in accordance with an aspect of one embodiment of the invention.
Figure 2:
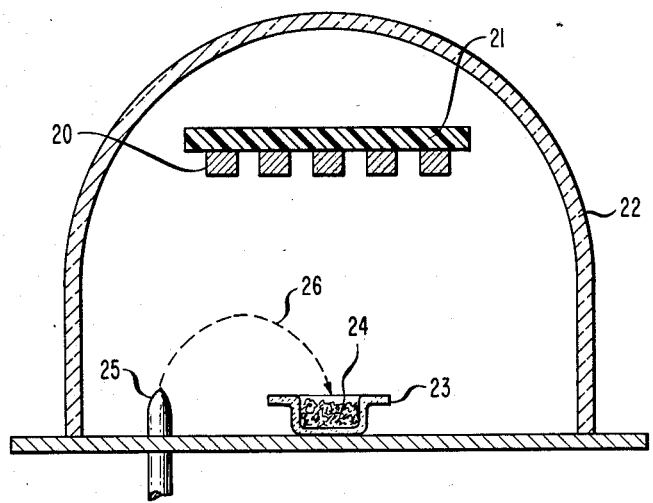
FIG. 2 is a side schematic view of apparatus utilized to practice the invention in accordance with another aspect of an embodiment of the invention.

In accordance with a main feature of the invention, the coating, 11, whether used as an AR or passivation layer, comprises $ZrO_2$ and an addition which stabilizes the material in the cubic form. This addition could be one or more of the oxides of yttrium, magnesium or calcium. Such layers can be deposited conveniently by electron beam evaporation as illustrated in FIG. 2 starting with a mixture of $ZrO_2$ and one or more of the oxides of Y, Mg and Ca, illustrated as 24, which material is prepared from a single crystal and has a cubic form. This source material is provided within a standard crucible 23, contained in an evacuated bell jar 22. Also included within the bell jar are a source of electrons, such as filament 25, and a substrate 21 including the lasers 20, to be created. Each laser includes a mask (not shown) over the areas of the device surface that will not be coated. The beam of electrons, illustrated as 26, is directed to the source material 24, to cause evaporation of said material and deposition on the laser surfaces in accordance with known techniques. (See for example, *Handbook of Thin Film Technology*, L. I. Maissel and R. Glang, Editors, McGraw Hill Book Company, New York, pp. 1–50, 1970.) Electron beam evaporation produces no significant damage to the semiconductor surface and permits in-situ monitoring of the layer thickness. Further, use of a single crystal source material in the form of fragments with their largest dimension being approximately a millimeter or more generally eliminates out-gassing and splattering which is often a problem when using a powdered source material. Single crystal material also has a higher purity than melted pellets which are often used as a substitute for powdered materials.

More important in terms of reproducibility is the fact that e-beam evaporation of the layer in accordance with the invention produces the desired index of refraction (1.6–2.0 for InP-based materials) without any introduction of oxygen into the evaporation chamber. Thus, in contrast to the use of $Al_2O_3$ or unmodified $ZrO_2$, control of film stoichiometry is not a problem and excellent reproducibility should result.

In a particular example, a number of standard CSBH lasers, which comprise an InGaAsP active region emitting light is 1.3 $\mu$m or 1.55 $\mu$m, were placed in the vacuum chamber. The surfaces of the mounted lasers, other than the mirror facets, were covered by a suitable mask which in this example was stainless steel. The source for the evaporated layer was placed in a crucible as shown adjacent to the filament so that an electron beam emitted by the filament would impinge on the source in accordance with standard practice. No oxygen was introduced into the chamber.

The source material was a mixture of approximately 10 mole percent $Y_2O_3$ and 90 mole percent $ZrO_2$, although it is expected that a range of 8–12 mole percent $Y_2O_3$ and 88–92 mole percent $ZrO_2$ would be preferred, while a range of 8–40 mole percent $Y_2O_3$ and 60–92 mole percent $ZrO_2$ is possible.

Electron bombardment of the source material was initiated and continued until a layer of approximately 4080 Angstroms thickness for the 1.55 $\mu$m light-emitting devices ($\lambda/(2n)$, where n=1.9) was evaporated onto the laser facets. Thickness was monitored by a quartz crystal oscillator.

This coating does not affect the electro-optical properties of the laser. Aging tests on the coated lasers showed no degradation compared with uncoated devices. However, the coated lasers were able to withstand up to 1 amp of applied current without any significant degradation of performance, while uncoated lasers typically can withstand currents of 250 milliamps.

In another example, the same procedure was followed for coating one facet of distributed feedback lasers with an active laser comprising InGaAs emitting light at 1.55 $\mu$m. In this example, however, the evaporated layer thickness was approximately 2040 Angstroms ($\lambda/(4n)$) so that the layer acted as an anti-reflection coating.

The coated lasers were found to exhibit a single mode emission as a result of suppression of the Fabry-Perot modes which would normally be present in uncoated lasers of this type.

It will be appreciated that although the specific examples above describe coating of laser facets, the invention is also useful for coating surfaces of other optical devices such as light-emitting diodes and photodetectors. Although the device structures were formed in InP substrates with multilayers of InP, InGaAs and InGaAsP, the invention should be generally applicable to III-V semiconductor materials, whether binary, ternary or quaternary, and further, could be applied to structures including II-VI semiconductors. In addition to the particular source material described, it is expected that advantageous results can be achieved from materials of $ZrO_2+CaO$, $ZrO_2+MgO$, or $ZrO_2$ and any combination of $Y_2O_3$, CaO and MgO. Suitable materials include, for example, 80–85 mole percent $ZrO_2$ and 15–20 mole percent CaO, or 84–90 mole percent $ZrO_2$ and 10–16 mole percent MgO.

Various additional modifications will become apparent to those skilled in the art. All such variations which basically rely on the teachings through which the invention has advanced the art are properly considered within the scope of the invention.

What is claimed is:

1. An optical device including a semiconductor material selected from the group consisting of III-V and II-VI semiconductors, said device comprising a coating formed by depositing from a source material over at least a portion of the surface of the device, characterized in that the coating comprises $ZrO_2$ and an oxide of an element selected from the group consisting of yttrium, magnesium, and calcium, and that said source material is a single crystal of $ZrO_2$ doped with one of said oxides.

2. The device according to claim 1 wherein the device is a laser with mirror facets and the coating covers at least one facet.

3. The device according to claim 2 wherein the device is a channeled substrate buried heterostructure capable of withstanding current pulses of 1 amp.

4. The device according to claim 2 wherein the device is a distributed feedback laser which emits light having a single longitudinal mode.

5. The device according to claim 1 wherein the thickness of the coating is an odd multiple of $\lambda/2n$ where $\lambda$ is the wavelength of the light emitted or received by the device and n is the index of refraction of the coating.

6. The device according to claim 1 wherein the thickness of the coating is an odd multiple of $\lambda/4n$ where $\lambda$ is the wavelength of the light emitted or received by the device and n is the index of refraction of the coating.

7. The device according to claim 1 wherein the coating consists essentially of $ZrO_2$ and $Y_2O_3$.

8. The device according to claim 7 wherein the proportion of $ZrO_2$ is within the range 88–92 mole percent and the proportion of $Y_2O_3$ is within the range 8–12 mole percent.

9. A method of fabricating an optical device including a semiconductor material selected from the group consisting of III-V and II-VI semiconductors, including coating at least a portion of the device surface comprising the steps of:
   providing a single crystal material comprising $ZrO_2$ and an oxide of an element selected from the group consisting of yttrium, magnesium, and calcium in a vacuum environment; and
   electron-beam evaporating the material so as to deposit a coating on the semiconductor surface.

10. The method according to claim 9 wherein no oxygen is introduced into the vacuum environment during the evaporation.

11. The method according to claim 9 wherein the material consists essentially of $ZrO_2$ and $Y_2O_3$.

12. The method according to claim 11 wherein the proportion of $ZrO_2$ is within the range of 88–92 mole percent and the proportion of $Y_2O_3$ is within the range 8–12 mole percent.

13. The method according to claim 9 wherein the thickness of the coating is an odd multiple of $\lambda/2n$ where $\lambda$ is the wavelength of the light emitted or received by the device and n is the index of refraction of the coating.

14. The method according to claim 9 wherein the thickness of the coating is an odd multiple of $\lambda/4n$ where $\lambda$ is the wavelength of the light emitted or received by the device and n is the index of refraction of the coating.